(12) United States Patent
Kamijo

(10) Patent No.: US 6,654,106 B2
(45) Date of Patent: Nov. 25, 2003

(54) METHODS AND APPARATUS FOR DETERMINING BLUR OF AN OPTICAL SYSTEM

(75) Inventor: Koichi Kamijo, Kumagaya (JP)

(73) Assignee: Nikon Corporation, Tokyo (JP)

( * ) Notice: Subject to any disclaimer, the term of this patent is extended or adjusted under 35 U.S.C. 154(b) by 101 days.

(21) Appl. No.: 10/037,141

(22) Filed: Jan. 2, 2002

(65) Prior Publication Data

US 2002/0125441 A1 Sep. 12, 2002

(30) Foreign Application Priority Data

Jan. 5, 2001 (JP) .................................... 2001-000285
Nov. 8, 2001 (JP) .................................... 2001-343174

(51) Int. Cl.$^7$ ................................................ G01J 1/00
(52) U.S. Cl. .................................... 356/121; 382/173
(58) Field of Search .......................... 356/121; 382/173

(56) References Cited

U.S. PATENT DOCUMENTS 6,548,800 B2 * 4/2003 Chen et al. ............... 250/208.1

FOREIGN PATENT DOCUMENTS

JP          2002-313704    * 10/2002   ......... H01L/21/027

OTHER PUBLICATIONS

Chu et al., "Numerical analysis of electron beam lithography systems. Part III: Calculation of the optical properties of electron focusing systems and dual-channel deflection systems with combined magnetic and electrostatic fields," *Optik* 61: 121–145, (1982).

* cited by examiner

*Primary Examiner*—Frank G. Font
*Assistant Examiner*—Roy M. Punnoose
(74) *Attorney, Agent, or Firm*—Klarquist Sparkman LLP

(57) ABSTRACT

Methods are disclosed for quantifying blur, of a beam of an optical medium, exhibited by an optical system through which the beam of the optical medium passes. An embodiment of the method includes the step of determining, in an image plane of the optical system, respective destination positions of a number (N) of rays of the optical medium originating according to a probability distribution from respective points in an object plane of the optical system. The destination positions are projected onto an axis in a direction, in the image plane, in which blur is to be quantified. Respective coordinates of each of the destination positions on the axis are determined and the determined coordinates are ranked. Blur is calculated from a profile of the ranked coordinates.

19 Claims, 2 Drawing Sheets

METHODS AND APPARATUS FOR DETERMINING BLUR OF AN OPTICAL SYSTEM

FIELD

This disclosure pertains to optical systems intended for use with a beam of light (e.g., ultraviolet light), charged particles, X-rays, and the like. More specifically, the disclosure pertains to methods and apparatus for obtaining a measurement of beam blur in such optical systems.

BACKGROUND

Beam blur is a problem that arises in various types of optical systems, especially optical systems that make use of a beam of charged particles such as electrons or ions. In a charged-particle-beam (CPB) optical system, blur is manifest whenever charged particles in the beam ideally intended to be converged at a single point on, e.g., an image plane actually exhibit a significant spread over a certain distance from the point. Such blur can arise from any of various factors. For example, blur can be caused by spherical aberration of the CPB optical system. As a result of spherical aberration, each location of a point on the image plane at which a charged particle (after having passed through the optical system) is incident is a function of the aperture angle distribution of the charged particles as they pass through the object plane.

By way of example, FIG. 4 illustrates an exemplary "spot diagram" (or "scatter diagram") of respective destination positions (at an image plane) of 3000 particles propagating through a CPB optical system of a CPB microlithography apparatus. In FIG. 4 the charged particles collectively exhibit blur at the image plane due to spherical aberration. The destination position of each charged particle in the plot is determined by assigning respective computed aberration coefficients to the charged particle. The aberration coefficients of each charged particle are computed according to a probability distribution of the incident angle of the charged particle at the object plane (reticle plane). Chu and Munro, *Optik* 61:121–145 (1982). In the example of FIG. 4, the incident angle of each charged particle incident on a reticle (at the object plane) is assigned a respective probability in the distribution of incident angles exhibited by the charged particles on the reticle.

Alternatively, for analyzing beam blur, well-known ray-tracing theory can be employed for determining the destination positions of charged particles passing through a CPB optical system. Whenever ray-tracing theory is used in this manner, the manner in which the charged particles propagate under the influence of a particular combination of electrical and magnetic fields is determined by solving an equation of motion for each particle.

A spot diagram or the like as shown in FIG. 4 generally depicts blur as manifest in two dimensions (X and Y dimensions) at the image plane. Alternatively to a spot diagram, in the context of a CPB microlithography apparatus comprising a CPB optical system, blur can be quantified. Quantified blur commonly is defined as the "full width at half maximum" (denoted "W") of a Gaussian distribution of beam intensity along a dimension (e.g., X or Y) in the image plane, typically at an edge of a projected pattern element. At such an edge, blur typically has a Gaussian distribution, wherein W generally is regarded as the portion of the distribution located within the range of approximately 12% to approximately 88% of maximum beam intensity. The range of W can vary (e.g., W can be from 10% to 90%) depending upon the accuracy and precision desired and upon other factors considered in determining blur of the particular system in question. Hence, "quantified blur" is distinguished from the comparatively qualitative depiction of blur such as shown in FIG. 4.

Quantified blur is a major factor used in determining the minimum pattern linewidth resolvable by a particular CPB microlithography apparatus. Rapid and accurate quantification of blur is necessary not only when designing an actual CPB microlithography apparatus but also when evaluating a particular reticle pattern to be exposed using the apparatus. For example, quantified blur can be used to produce data concerning any local resizing or the like of the pattern as defined on the reticle, as required for correcting proximity effects.

An exemplary conventional procedure for quantifying blur is based on preparing a grouped tabulation of obtained data concerning destination positions. The grouped data thus are suitable for plotting as a histogram from which blur is quantified. The method comprises the following steps:

(a) A sequence a[i] of "i" groups (i=1, 2, 3, . . . n) is designated, wherein each group corresponds to a respective range of destination positions "x" or "y" along a respective dimension (X or Y) in the image plane. In a subsequent step, the respective numbers of individual charged particles incident in the respective range corresponding to each group are tallied. The number n of groups typically is selected based on a tradeoff of calculation accuracy and available time to perform the calculations. The total range is sufficiently large to allow accounting for all the charged particles. By way of example, whenever spherical aberration is the dominant manifestation of beam blur, it is possible to determine, at least roughly, the range of aberration data. For each charged particle, the aberration is calculated by multiplying the aberration coefficient by the third power of the particle's incident angle. E.g., if the incident angle is limited to 6 mrad and the aberration coefficient is 0.1, then the maximum destination position is $(0.1)(6/1000)^3 = 21.6$ nm from the convergence point. In this situation, this step (a) is performed before step (b), below.

However, if no prior knowledge exists about the range of data that will be obtained in step (b), then step (b) is performed before step (a). I.e., the data obtained in step (b) is reviewed to determine a suitable number of groups and/or their respective ranges. (Alternatively, the program used to perform steps (a) and (b) can accommodate adding more groups or re-setting group ranges.)

The range of each group is determined based on the required accuracy of the calculations. Hence, if the required accuracy, the total range of the data, and the maximum destination position of the data are known, then n can be readily determined.

(b) A defined number of values of a particular beam parameter (i.e., a parameter that affects blur, such as aperture angle) is selected. The selection is performed either randomly or according to a desired distribution. For example, a randomly selected population of 100 aperture angles is selected. The values are individually substituted into an appropriate function for the particular parameter (e.g., an aberration function) or in a ray-tracing program. The corresponding destination positions of charged particles at the image plane are determined from the substitution calculations or ray traces. If a destination position determined from a single calculation or ray trace falls within a particular destination-position group as designated in step (a), then the tally for that group is incremented by one. The tally data are plotted as a histogram comprising bars corresponding to respective groups.

(c) Step (b) is repeated as required until a satisfactory discernment can be made, from the histogram, of the distribution of the destination positions of the charged particles. The histogram extends in a specific axis direction (e.g., X or Y direction), and the "components" of the distribution (each component corresponding to a respective bar of the histogram) in that axis direction are determined.

(d) For each component of the distribution determined in step (c), a convolution is performed of the distribution with a step function. For example, if the specific axis direction is the X-axis, then the convolution is performed with a step function such that the result of the convolution is 0 at x<0 and 1 at x≧0. The blur is quantified in the specific axis direction based on the result of the respective convolution. For example, the difference between respective values of x corresponding to 12% and 88% of the maximum value of the convolution function is the quantified blur.

A Gaussian function can be defined in which the quantified blur determined as summarized above is regarded as the full width at half maximum of the distribution. If this function is a point-spread function (PSF), then proximity-effect calculations or exposure calculations can be performed using the PSF.

A specific example of this conventional procedure is as follows. A sequence a[i] (where i=1, 2, 3, . . . 8) of eight groups is designated (n=8). Each group corresponds to a respective range of x coordinates of destination positions, according to the expression $(i-5)*10 \leq x < (i-4)*10$ (nm). Hence, $-40 \leq x \leq -30$ for the group in which i=1, and $-30 \leq x \leq -20$ for the group in which i=2, and so on. Assuming the charged particle beam is an electron beam, each destination position on the image plane is a function of the respective aperture angle of a respective electron in the beam. Twenty-five aperture angles are selected randomly and substituted into an aberration function to yield the respective projections onto the x-axis of the resulting destination positions. The resulting data are listed in Table 1. (The destination positions alternatively can be determined using ray-tracing theory instead of an aberration function.)

TABLE 1

| Particle number | Destination position (nm) |
|---|---|
| 1 | −9.1313 |
| 2 | −0.00256 |
| 3 | 3.21164 |
| 4 | −4.74108 |
| 5 | 0 |
| 6 | 5.722305 |
| 7 | −3.13189 |
| 8 | 0.00072 |
| 9 | 9.002748 |
| 10 | −31.7071 |
| 11 | −2.03115 |
| 12 | 0.021912 |
| 13 | 12.35585 |
| 14 | −25.1993 |
| 15 | −0.80672 |
| 16 | 0.153312 |
| 17 | 16.99916 |
| 18 | −17.1993 |

TABLE 1-continued

| Particle number | Destination position (nm) |
|---|---|
| 19 | −0.07794 |
| 20 | 0.577121 |
| 21 | 21.13388 |
| 22 | −11.7665 |
| 23 | −0.00788 |
| 24 | 1.528142 |
| 25 | 35.00438 |

In this example, steps (b) and (c), above, yield a determination of the distribution of the destination positions in the x-axis direction for the eight groups i =1,2,3, . . . 8 as shown in Table 2 and plotted in FIG. 1, in which, essentially, the data of Table 1 are sorted into their respective groups and tallied. The convolution (step (d)) yields the data listed in Table 3 and plotted in FIG. 2, in which the data of Table 2 are set forth as cumulative counts. In FIGS. 1 and 2, group numbers (i) are plotted on the abscissa in order of increasing numerical designation, and respective tallies ("counts") are plotted on the ordinate (the counts in Table 3 and FIG. 2 are cumulative counts). The Gaussian distribution of the data is evident in FIG. 1. FIG. 2 shows the 12% and 88% lines of the cumulative distribution.

TABLE 2

| i | Count |
|---|---|
| 1 | 1 |
| 2 | 1 |
| 3 | 2 |
| 4 | 8 |
| 5 | 9 |
| 6 | 2 |
| 7 | 1 |
| 8 | 1 |

TABLE 3

| i | Cumulative Count |
|---|---|
| 1 | 1 |
| 2 | 2 |
| 3 | 4 |
| 4 | 12 |
| 5 | 21 |
| 6 | 23 |
| 7 | 24 |
| 8 | 25 |

The quantified blur is obtained from histogram data situated between the 12% and 88% limit lines shown in FIG. 2, representing the range of 12% to 88% of the maximum value of the convolution function. In FIG. 2, the 12% line corresponds to a cumulative count of 3. Hence, the three most negative destination positions (i.e., −31.7071, −25.1993, and −17.1993) are outside the 12% limit, and the fourth most negative destination position (−11.7665) is inside the stated range. Thus, about half the bar corresponding to i=3 is inside the stated range and about half is outside the stated range. Since the bar corresponding to i=3 covers the range x=−20 to −10, the value of x corresponding to the 12% limit is designated as −15 nm. Similarly, the 88% line corresponds to a cumulative count of 22. Hence, the three most positive destination positions (i.e., 16.94416, 21.13388 and 35.00438) are outside the 88% limit, and the fourth most positive destination position (9.002748) is inside the stated range. Thus, about half the bar corresponding to i=6 is inside the stated range, and about half is outside the stated range. Since the bar i=6 covers the range x=10 to 20, the value of x corresponding to the 88% limit is designated as 15 nm. In summary, regarding this data, the respective corresponding destination positions are:

25* 0.12=3; thus x=−15 nm

25* 0.88=22; thus x=+15 nm

The quantified blur is the difference between the two values of x; i.e., 15−(−15)=30 nm.

With the conventional method summarized above, to increase the accuracy and precision of the determined values of blur, the width of each group of the sequence a[i] should be as short as possible (i.e., n should be as large as practicable). Unfortunately, with increases in n, a correspondingly greater number of individual destination positions should be calculated to obtain a meaningful tally in each group. These requirements result in very long computation times, which are impractical or impossible to accommodate especially in modern high-throughput fabrication environments. Also, by calculating blur based on data concerning respective positions and midpoints of histogram bars, a certain inaccuracy of blur calculation inevitably results.

SUMMARY

In view of the shortcomings of conventional methods, as summarized above, for quantifying beam blur, the present invention provides, inter alia, methods and apparatus for quantifying blur at high accuracy from a minimal quantity of data.

According to a first aspect of the invention, methods are provided for quantifying blur, of a beam of an "optical medium," exhibited by an optical system through which the beam of the optical medium passes. The "optical medium" in this context can be, for example, light, X-rays, or charged particle beams. In an embodiment of the method, in an image plane of the optical system, respective destination positions of a number (N) of rays of the optical medium are determined. The rays are regarded as originating according to a probability distribution (e.g., a random probability distribution) from respective points in an object plane of the optical system. The destination positions are projected onto an axis in a direction, in the image plane, in which blur is to be quantified. Respective coordinates of each of the destination positions on the axis are determined. The determined coordinates are ranked. From the ranking numbers and the respective determined coordinates, blur is calculated.

The destination positions can be determined from respective ray traces of the optical medium extending from points on the probability distribution and through the optical system to the respective destination positions on the image plane. Alternatively, the destination positions can be determined according to respective solutions of an aberration function.

Blur desirably is quantified as a region between a predetermined lower limit and a predetermined upper limit. By way of example, the lower limit and upper limit can be determined so as to include, in the calculation of blur, only destination-position data located between a lower limit of 12% and an upper limit of 88%.

Continuing further with the example, the lower limit can be determined to exclude, from the calculation of blur, 12% of the total number of destination positions that are most negative. Similarly, the upper limit can be determined to exclude 12% of the total number of destination positions that are most positive.

Blur can be calculated as respective coordinates of respective destination positions corresponding, in the ranked data, to a predetermined lower limit and a predetermined upper limit.

According to another aspect of the invention, apparatus are provided for quantifying blur, of a beam of an optical medium, exhibited by an optical system through which the beam of the optical medium passes. An embodiment of the apparatus comprises means for determining, in an image plane of the optical system, respective destination positions of a number (N) of rays of the optical medium originating according to a probability distribution from respective points in an object plane of the optical system. The apparatus also includes means for calculating respective coordinates of the destination positions on a projection axis, in the image plane, in which blur is to be quantified. The apparatus also includes means for ranking the coordinates, and means for calculating blur from the ranked coordinates.

With methods and apparatus as disclosed herein, the actual data regarding ranked destination positions are used rather than data pertaining to a histogram of such data. Even though histograms are useful for certain data-analysis purposes, the act of converting data to a histogram inevitably tends to bury the data. By using the destination-position data directly, the inherent inaccuracies imposed by creating a histogram are not introduced. Thus, blur is calculated more quickly and more accurately using less data.

The foregoing and additional features and advantages of the invention will be more readily apparent from the following detailed description, which proceeds with reference to the accompanying drawings.

DETAILED DESCRIPTION

Figure 1:
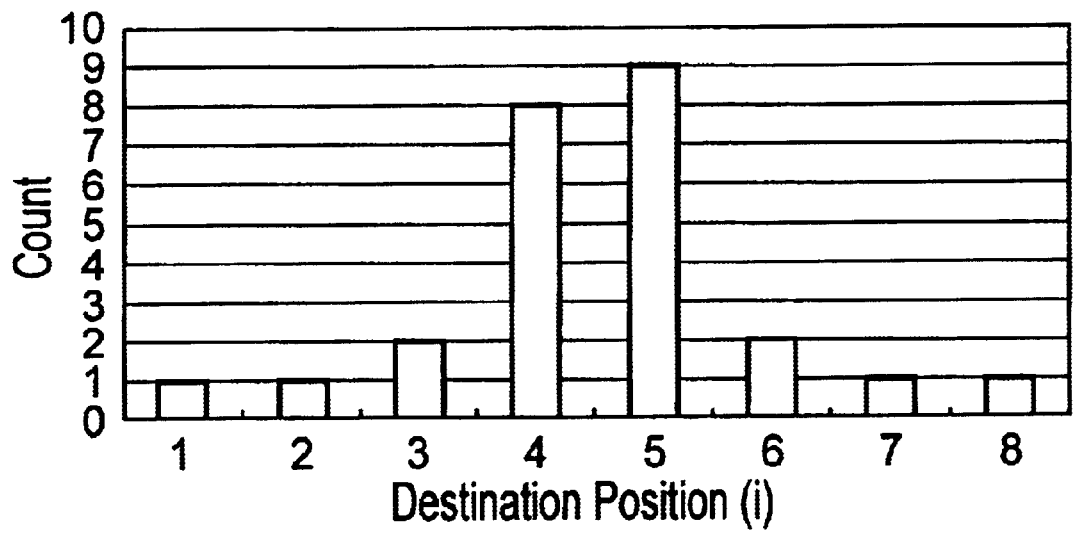
FIG. 1 is a histogram of exemplary data concerning respective tallies ("counts") of charged particles in each of multiple ranges of destination positions at the image plane, according to a conventional method for quantifying beam blur.

The invention is described below in the context of a representative embodiment, which is not intended to be limiting in any way.

The key distinction of a method according to the invention compared to the conventional method summarized above is that the method according to the invention does not involve converting raw destination-position data into a histogram or determining a sequence a[i]. Rather, the raw destination-position data are ranked and used directly, thereby yielding a more accurate quantification of blur using the same or less data and in less time than the conventional method.

An embodiment of a method includes the following steps: (1) For N rays or charged particles propagating from respective points in an object plane, the respective destination positions in the image plane are calculated using a ray-trace program or by substituting into an aberration function of parameter(s) associated with a probability distribution of generated charged particles. (2) Each of the N rays or charged particles is projected onto respective destination positions on an axis in the direction in which the blur is to be quantified. The coordinates of each ray or charged particle on the axis are determined. (3) The determined coordinates are ranked by magnitude. By way of example, a commercially available algorithm such as "Quick Sort" can be used for this data sorting, so as to reduce sorting time. This data sorting is effectively the same as performing a convolution, but it does not require the complicated calculations or the long calculation time of a convolution. From these sorted data, the lower and upper limits (e.g., 12% and 88% limits) are assigned, between which the blur is "quantified."

With this method, compared to a histogram plot of grouped data, the actual coordinates of the lower and upper limits can be determined with high accuracy, which enables blur to be quantified with substantially greater accuracy than with the conventional method.

By way of example, consider the destination-position data set forth in Table 1. Assume that the Table-1 data pertain to the distribution of destination positions in the X direction in the image plane. Alternatively, both dimensions (X and Y) of the image plane can be considered. The destination-position data are arranged ("ranked") in order of increasing magnitude and listed in Table 4. I.e., in Table 4, the individual particles are ranked beginning with the most negative destination position and proceeding to the most positive destination position.

TABLE 4

| Particle number | Ranked destin. position (nm) |
|---|---|
| 1 | −31.7071 |
| 2 | −25.1993 |
| 3 | −17.1993 |
| 4 | −11.7665 |
| 5 | −9.1313 |
| 6 | −4.74108 |
| 7 | −3.13189 |
| 8 | −2.03115 |
| 9 | −0.80672 |
| 10 | −0.07794 |
| 11 | −0.00788 |
| 12 | −0.00256 |
| 13 | 0 |
| 14 | 0.00072 |
| 15 | 0.021912 |
| 16 | 0.153312 |
| 17 | 0.577121 |
| 18 | 1.528142 |
| 19 | 3.21164 |
| 20 | 5.722305 |
| 21 | 9.002748 |
| 22 | 12.35585 |
| 23 | 16.99916 |
| 24 | 21.13388 |
| 25 | 35.00438 |

Figure 3:
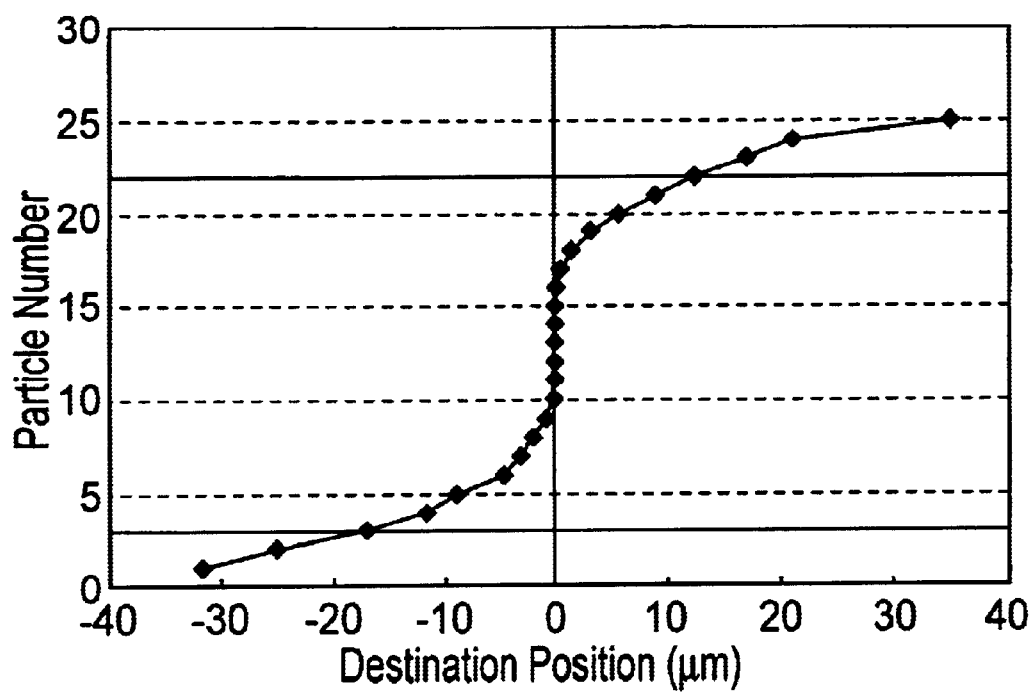
FIG. 3 is a plot of exemplary ranked data prepared according to an embodiment of a method according to the invention.
Figure 4:
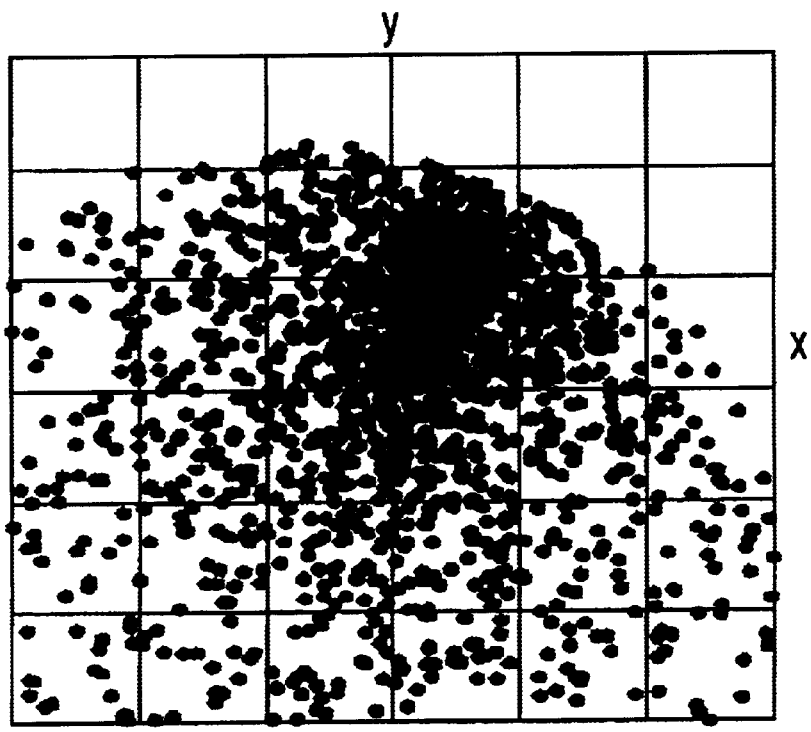
FIG. 4 is an exemplary conventional "spot" or "scatter" diagram depicting blur at the image plane.

FIG. 3 is a plot of the ranked data in Table 4. In this example the depicted plot of the data in FIG. 3 is clustered along a central axis (vertical line from destination position "0"), although data in another example would not necessarily be clustered in this manner. I.e., the data can be skewed (shifted), for example. However, even if the data were skewed along the abscissa, the distance along the abscissa between the upper limit and the lower limit would not necessarily change.

In the plot of FIG. 3 the central axis corresponds to a coordinate on the abscissa representing the median of the distribution of data. The plot also has respective tails extending toward coordinates of the most negative (relative to the "0" coordinate) destination positions and toward coordinates of the most positive (relative to the "0" coordinate) destination positions. The plot also shows the 12% and 88% limit lines, between which blur is quantified in this example.

Figure 2:
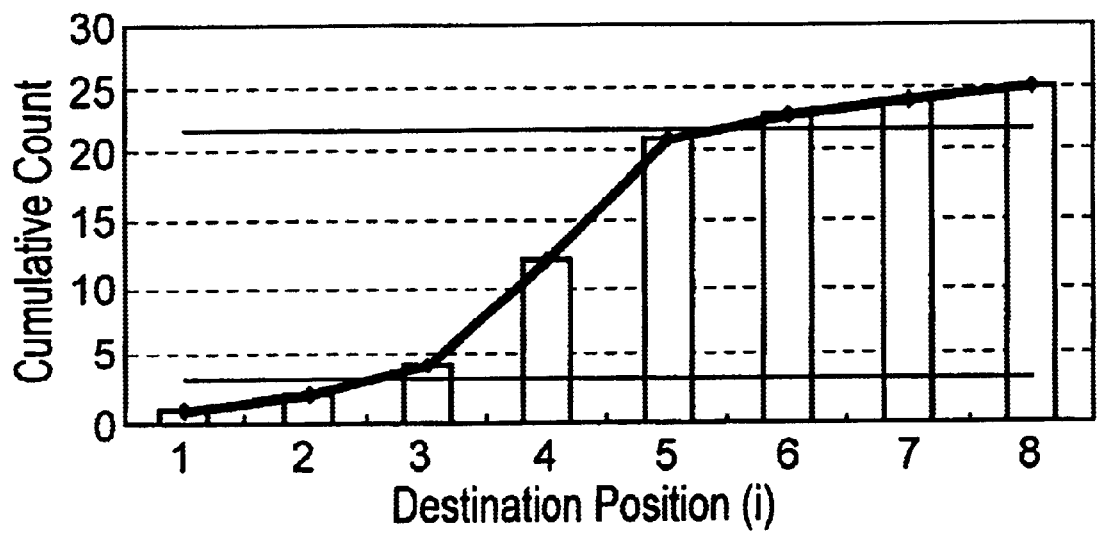
FIG. 2 is a histogram of the data in FIG. 1, set forth in terms of cumulative counts associated with each successive bar of the histogram, determined by a point spread function.

As can be seen by comparing FIGS. 2 and 3, FIG. 3 does not involve grouped data. Rather, FIG. 3 is a plot of all the actual ranked data. The plot in FIG. 2, in contrast, is a histogram of grouped data, in which the 12% and 88% limits are approximated from the positions of respective histogram bars rather than actual data. Hence, the profile of the distribution in FIG. 2 involves substantial rounding-off of data, whereas ranking the data does not. In FIG. 3, if quantified blur is the portion of the distribution located between the 12% and 88% lines, then the respective destination points corresponding to these limits are:

25*0.12=3; thus, x=−17.20 nm

25*0.88=22; thus, x=+12.36 nm

The coordinates of −17.20 and 12.36 were determined from the particle numbers 3 and 22, respectively, in Table 4. The quantified blur is the difference between these two values of x; i.e., 12.36−(−17.20)=29.56 nm. In the plot of FIG. 3 the upper and lower limits are denoted on the ordinate, and the corresponding quantified blur is denoted as the region on the abscissa between the upper and lower limits.

If the calculated upper or lower limit is not an integer, then interpolation or similar method can be used to calculate blur between the limits. However, the total number of charged particles typically is large (e.g., 3000), which generally obviates any need for interpolation and allows the limits to be calculated directly (e.g., 360 and 2640, respectively, in this example). If the total number of charged particles is relatively small (e.g., substantially less than 3000), then a data-smoothing technique (e.g., determining a best-fit curve of the data) can be used to increase the accuracy of the blur calculation.

When compared with the more approximate difference of 30 nm obtained by the conventional method discussed above, the substantially greater accuracy with which blur is quantified according to this embodiment is readily apparent. It also is readily apparent that this substantially greater accuracy is obtained without having to increase the size of the data set of individual values of destination positions or having to perform more complex calculations. In fact, the calculations involved in this embodiment are less complex and hence less time-consuming than the conventional method. Also, because a substantially greater quantification accuracy is obtained with this embodiment, the actual number of individual values of destination positions can be smaller than required for quantifying blur using the conventional method. In the conventional method, the steps of forming groups, tallying data, producing a histogram, and analyzing the histogram consume time that is not required to perform the method embodiment disclosed above, in which a usable result is obtained with high accuracy merely by ranking the data. Consequently, computation time is reduced especially if a high-speed data-ranking program is used.

It will be readily understood that the invention also encompasses machine instructions (e.g., computer program), stored on or in an appropriate machine-readable storage medium. The machine instructions would include the steps of the method described above, and would be "read" by a computer or the like that would perform the calculations and other data processing according to the machine instructions.

This embodiment is described in the context of using the aperture angle of the beam as an exemplary variable in the aberration function. It will be understood that any of various other variables can be used. For example, similar calculations can be performed by determining corresponding particle-energy values at a respective probabilities based on a lateral distribution of beam energy accelerated by a particular voltage (e.g., 100 kV). The destination positions of the charged particles are determined according to these probability values. Naturally, multiple parameter values can be varied simultaneously.

This embodiment was described in the context of using an electron beam as a charged particle beam. It will be understood that an alternative charged particle beam (e.g., ion beam) or a beam of light or X-rays could have been used instead with similar quality results obtained.

Although the invention has been described in the context of a representative embodiment, it will be understood that the invention is not limited to that embodiment. On the contrary, the invention is intended to encompass all alternatives, modifications, and equivalents as may be included within the spirit and scope of the invention, as defined by the appended claims.

What is claimed is:

1. A method for quantifying blur, of a beam of an optical medium, exhibited by an optical system through which the beam of the optical medium passes, the method comprising the steps:

in an image plane of the optical system, determining respective destination positions of a number (N) of rays of the optical medium originating according to a probability distribution from respective points in an object plane of the optical system;

projecting the destination positions onto an axis in a direction, in the image plane, in which blur is to be quantified;

determining respective coordinates of each of the destination positions on the axis;

ranking the determined coordinates so as to provide a ranking number for each destination position; and from the ranking numbers and the respective determined coordinates, calculating blur.

2. The method of claim 1, wherein the optical medium is selected from the group consisting of light, X-rays, and charged particle beams.

3. The method of claim 1, wherein the destination positions are determined from respective ray traces of the optical medium extending from points on the probability distribution, and through the optical system to the respective destination positions on the image plane.

4. The method of claim 1, wherein the destination positions are determined according to respective solutions of an aberration function.

5. The method of claim 1, wherein the blur is quantified as a region between a predetermined lower limit and a predetermined upper limit.

6. The method of claim 1, wherein the lower limit and upper limit are determined so as to include, in the calculation of blur, only destination-position data located between a lower limit of 12% and an upper limit of 88%.

7. The method of claim 6, wherein the lower limit is determined to exclude, from the calculation of blur, 12% of the total number of destination positions that are most negative, and the upper limit is determined to exclude 12% of the total number of destination positions that are most positive.

8. The method of claim 1, wherein the respective rays of the optical medium originate at the object plane according to a random probability distribution.

9. The method of claim 1, wherein the blur is calculated as coordinates of respective destination positions corresponding, in the ranked data, to a predetermined lower limit and a predetermined upper limit.

10. A machine-readable medium, comprising a program for executing a method as recited in claim 1.

11. An apparatus for quantifying blur, of a beam of an optical medium, exhibited by an optical system through which the beam of the optical medium passes, the apparatus comprising:

means for determining, in an image plane of the optical system, respective destination positions of a number (N) of rays of the optical medium originating according to a probability distribution from respective points in an object plane of the optical system;

means for calculating respective coordinates of the destination positions on a projection axis, in the image plane, in which blur is to be quantified;

means for ranking the coordinates; and means for calculating blur from the ranked coordinates.

12. The apparatus of claim 11, wherein the optical medium is selected from the group consisting of light, X-rays, and charged particle beams.

13. The apparatus of claim 11, wherein said means for calculating respective coordinates of the destination positions comprises means for calculating the coordinates from respective ray traces of the optical medium extending from points on the probability distribution, and through the optical system to the respective destination positions on the image plane.

14. The apparatus of claim 11, wherein said means for calculating respective coordinates of the destination positions comprises means for calculating the coordinates from respective solutions of an aberration function.

15. The apparatus of claim 11, wherein said means for calculating blur is configured to calculate blur as a respective region between a predetermined lower limit and a predetermined upper limit.

16. The apparatus of claim 11, wherein said means for calculating blur is configured to regard the lower limit and upper limit so as to include, during calculations of blur, only destination position data located between a lower limit of 12% and an upper limit of 88%.

17. The apparatus of claim 16, wherein said means for calculating blur is configured to regard the lower limit so as to exclude, during calculations of blur, 12% of a total number of destination positions that are most negative, and to regard the upper limit so as to exclude, during calculations of blur, 12% of the total number of destination positions that are most positive.

18. The apparatus of claim 11, wherein said means for determining destination positions is configured to regard the respective rays of the optical medium as originating at the object plane according to a random probability distribution.

19. The apparatus of claim 11, wherein said means for calculating blur is configured to calculate blur as respective coordinates of respective destination positions corresponding, in the ranked data, to a predetermined lower limit and a predetermined upper limit.

* * * * *